(12) United States Patent
Glebov et al.

(10) Patent No.: US 7,394,842 B2
(45) Date of Patent: Jul. 1, 2008

(54) VOLUME BRAGG LASERS BASED ON HIGH EFFICIENCY DIFFRACTIVE ELEMENTS IN PHOTO-THERMO-REFRACTIVE GLASS

(75) Inventors: Leonid B. Glebov, Oviedo, FL (US); Vadim I. Smirnov, Orlando, FL (US); George Venus, Oviedo, FL (US)

(73) Assignee: Research Foundation of the University of Central Florida, Inc., Orlando, FL (US)

( * ) Notice: Subject to any disclaimer, the term of this patent is extended or adjusted under 35 U.S.C. 154(b) by 458 days.

(21) Appl. No.: 11/114,767

(22) Filed: Apr. 26, 2005

(65) Prior Publication Data
US 2005/0207466 A1 Sep. 22, 2005

Related U.S. Application Data

(63) Continuation-in-part of application No. 10/665,339, filed on Sep. 19, 2003, now Pat. No. 7,326,500, which is a continuation-in-part of application No. 09/750,708, filed on Dec. 28, 2000, now Pat. No. 6,673,497, which is a continuation-in-part of application No. 09/648,293, filed on Aug. 24, 2000, now Pat. No. 6,586,141.

(60) Provisional application No. 60/606,280, filed on Aug. 31, 2004, provisional application No. 60/174,432, filed on Jan. 4, 2000.

(51) Int. Cl.
*H01S 3/08* (2006.01)

(52) U.S. Cl. .......................................... 372/102; 372/99

(58) Field of Classification Search ................... 372/18, 372/19, 20, 99, 9, 102
See application file for complete search history.

(56) References Cited

U.S. PATENT DOCUMENTS 4,752,130 A * 6/1988 George et al. ............... 356/334

OTHER PUBLICATIONS

Emifov et al, High Efficiency Bragg Gratings in Photothermorefractive Glass, Applied Optics, Feb. 1, 1999, vol. 38, No. 4.*

* cited by examiner

*Primary Examiner*—Armando Rodriguez
(74) *Attorney, Agent, or Firm*—Brian S. Steinberger; Phyllis K. Wood; Law Offices of Brian S. Steinberger, P.A.

(57) ABSTRACT

A volume Bragg laser including a resonator comprising photo-thermo-refractive (PTR) volume diffractive elements that can be used in a laser emitting window of transparency of PTR glass to provide control of the lasers spectral and angular parameters, and methods, devices, apparatus and systems related thereto. The high efficiency volume Bragg gratings recorded in photo-thermo-refractive (PTR) glass preferably has an absolute diffraction efficiency exceeding approximately 95% in transmitting and reflecting modes is used for selection of a transverse and longitudinal mode for thermal, optical and mechanical stabilization of the volume Bragg lasers and coherent coupling of different lasers. Robustness, compactness, thermal and laser stability along with the ability to place several elements in the same space allows the use of sophisticated optical system according to the invention in fields of military lasers, optical communications, data storage and processing, and the like.

12 Claims, 15 Drawing Sheets

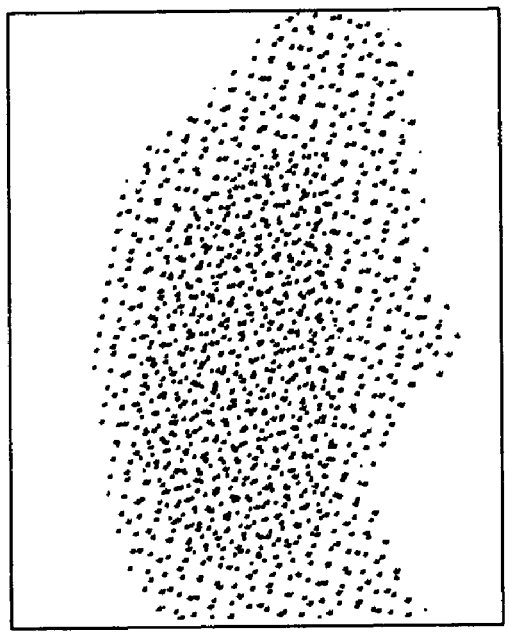 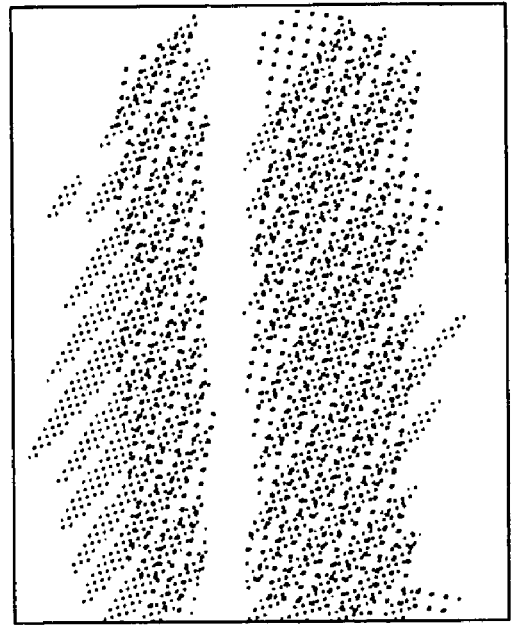
Fig.18A　　　　Fig.18B
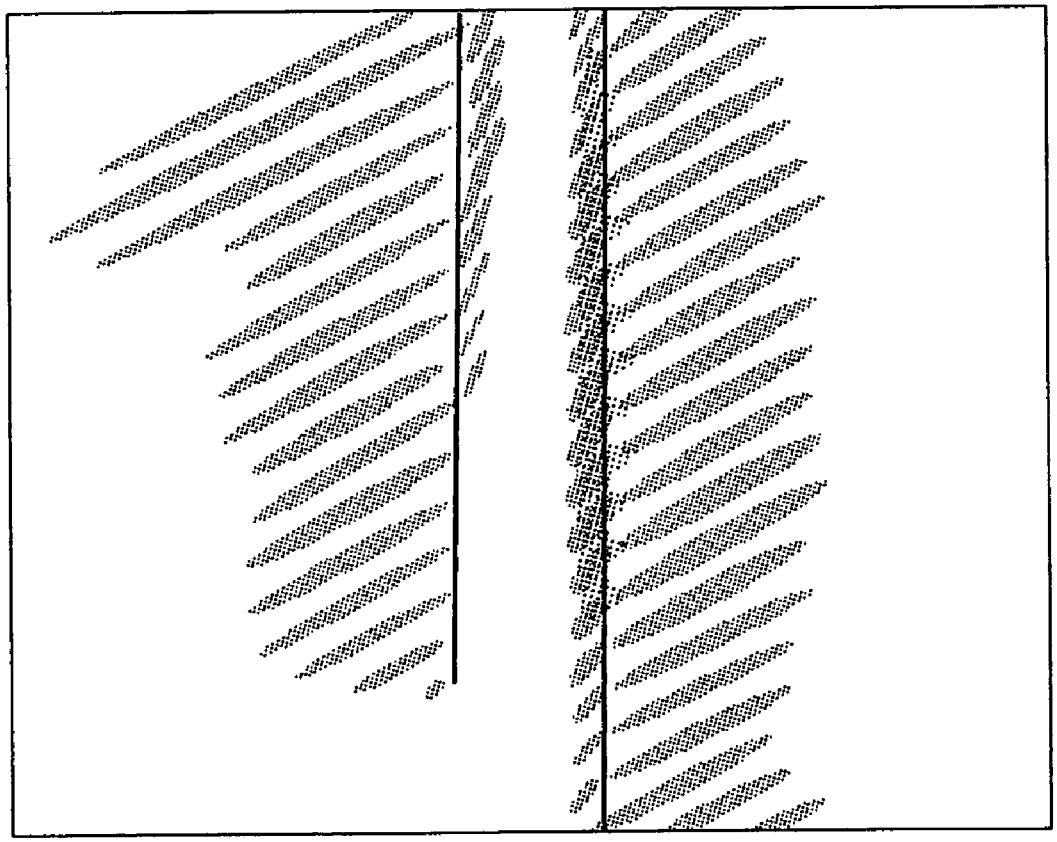
Fig.19

VOLUME BRAGG LASERS BASED ON HIGH EFFICIENCY DIFFRACTIVE ELEMENTS IN PHOTO-THERMO-REFRACTIVE GLASS

This invention is a Continuation-In-Part of U.S. patent application Ser. No. 10/665,339 filed Sep. 19, 2003, now U.S. Pat. No. 7,326,500, which is a Continuation-In-Part of U.S. patent application Ser. No. 09/750,708 filed Dec. 28, 2000, now U.S. Pat. No. 6,673,497, which is a Continuation-In-Part of U.S. patent application Ser. No. 09/648,293 filed on Aug. 24, 2000, now U.S. Pat. No. 6,586,141 which claimed priority from U.S. Provisional Application Ser. No. 60/174,432 filed Jan. 4, 2000, by the same assignee as that of the subject invention, and further claims the benefit of priority from U.S. Provisional Application Ser. No. 60/606,280 filed on Aug. 31, 2004, and was funded by the Air Forces Research Laboratory contract No. HR-01-1041-0004.

FIELD OF THE INVENTION

This invention relates to diffractive optical elements and more specifically those diffractive optical elements produced from photosensitivity photo-thermo-refractive (PTR) glass with absolute diffractive efficiency exceeding 95% and their use as volume Bragg gratings in laser resonators for transverse and longitudinal mode selection, and to methods, apparatus, systems and devices related thereto.

BACKGROUND AND PRIOR ART

The use of external selective feedback for spectral narrowing and tuning of single semiconductor lasers started in the early 1970s and was described in numerous original publications and in several classical monographs such as K. Petermann, "Laser Diode Modulation and Noise", 1988 and L. Coldren, S. W. Corzine "Diode laser and Photonic Intergrated Circuits", 1995. After development of laser diode stacks, the same methods have been adapted to such multichannel devices and a number of recent experiments have demonstrated improvements of spectral width of broad area laser diode bars.

Two technical approaches were used, an optical injection method and an external cavity technique with selective spectral elements in a feedback loop. Most interesting and promising results for the use of injection wavelength locking and beam quality improvements were recently observed in Oak Ridge National Laboratory (see Y. Liu, H. K. Liu, Y. Braiman, "Injection locking of individual lasers in an integrated high-power diode array", Appl. Phys. Lett. 81 (2002), pp. 978-980. Using a 0.5 mW injection beam from a single-mode and single-frequency LD to each 125 µm-wide emitter in a bar consisting of 19 diodes, up to 1 W power with a narrow spectrum from each emitter was achieved. At this power, the line width of 8 MHz was concentrated near 60% of radiation. The remaining energy was distributed continuously in a wide spectrum similar to that of a free running laser. For a pumping stack, such precise spectral narrowing and stabilization are even better than necessary. However, significant a part of the radiation outside of the narrow spectral region is not acceptable for highly efficient pumping systems. Additionally, injection wavelength locking meets some serious problems from the point of view of compact, cheap and reliable design, which is necessary for pumping stack.

In a classical optical design, a spectrally selective feedback with a surface diffractive grating was used for narrowing and stabilization the spectral width of laser bar. Theoretically, it was demonstrated that for a stabilized LD source with an external cavity, the requirement of a narrow line width is not in a contradiction with the requirement of maximum efficiency. (See V. Annovazzi-Lodi, S. Merlo, N Moron in "Power efficiency of a semiconductor laser with an external cavity". Opt. and Quant. Electronics 32 (2000), pp. 1345-1350). After 6 years of experiments with spectral stabilized laser diode stacks, the state-of-the-art efficiency did not exceed 60-65% compared to the efficiency of a free running laser under high pumping conditions. This result was demonstrated by B. Chann, I. Nelsonand T. G. Walker in "Frequency-narrowed external-cavity diode-laser-array bar". Opt. Lett. 25 (2000) 1352-1355. In their experiments a fraction of the output power in the narrowed peak decreased with increasing current from 85% near threshold pumping current to 68% under high pumping conditions. Maximum output power in a narrow spectral line (60 GHz) run up to 12.2 W for 20 W laser diode bar in an external cavity configuration. For design of the external cavity, the authors used Littrow or Littman-Metcalf optical schemes with blazed surface grating and in both case they achieved similar experimental results. Decreasing of optical power in narrow line under high pumping condition is explained by the thermal distortions of the surface grating which resulted in additional optical losses. Similar grating behavior was observed in spectral combining experiments and plays a significant role for illumination of metallized surface grating by power beam with energy near 10 W or higher. (See S. J. Augst, A. K. Goyal, R. L. Aggarwal, T. Y. Fan, and A. Sanchez. Wavelength beam combining of ytterbium fiber lasers. Optics Letters 28 (2003) 331-333). However, it is shown in the spectral combining experiments with Yb-doped fiber lasers that the volume PRT grating is absolutely stable under illumination at least one order of value higher and has very low absorption losses. (See (L. B. Glebov, V. I. Smirnov, C. M. Stickley, I. V. Ciapurin. New approach to robust optics for HEL systems. In Laser Weapons Technology III. W. E. Tompson and P. H. Merritt, Editors. Proceedings of SPIE, 4724 (2002) 101-109). This data provides work in a wide range of laser diode-stack output powers with high initial efficiency in narrow spectral lines and allows for designing simple and reliable external cavity with transparent volume diffractive gratings in PTRG.

Recently, the use of photo-thermo-refractive volume diffractive gratings for spectral and angular selection in semiconductor lasers were described in (B. L. Volodin, S. V. Dolgy, E. D. Melnik, E. Downs, J. Shaw, V. S. Ban. Efficient technology for wavelength stabilization and spectrum narrowing of high-power laser diodes and arrays. Advanced Solid State Photonics, 2004).

However, prior art publications fail to teach an adequate level of efficiency of laser devices or a useful narrowing of output frequencies at requisite high levels of pumping.

SUMMARY OF THE INVENTION

The first objective of the present invention is to increase the brightness of lasers through narrowing of spectral width and angular divergence of emission by means of an external resonator which includes high efficiency diffractive optical elements.

The second objective of the present invention is to provide significant spectral and angular narrowing of laser radiation at high levels of pumping by means of high spectral and angular selectivity combined with high thermal and laser stability and low losses of volume Bragg gratings recorded in a photo-thermo-refractive (PTR) glass.

The third objective of the present invention is to provide high efficient longitudinal and transverse mode selection down to single mode oscillation for different types of lasers such as solid state, semiconductor, liquid, and gas ones.

The fourth objective of the present invention is to provide spectral and angular narrowing for multichannel laser systems, e.g. laser diode bars and stacks.

The fifth objective of the present invention is to provide coherent and incoherent coupling of multiple laser emitters into a multichannel laser system.

The sixth objective of the method, apparatus, system and device of the present invention is to provide combination of collimating and projecting optical elements with diffractive optical elements by recording complex holograms in PTR glass or by proper shaping of its surfaces.

The seventh objective of the present invention uses PTR volume Bragg gratings as elements in laser resonators to provide high diffraction efficiency, low losses, and wide variety of spatial frequencies and thicknesses.

The eighth objective of the method, apparatus, system and device of the present invention is to provide a multi-channel volume Bragg laser based on the use of high efficiency volume Bragg gratings which simultaneously provides coupling between channels, output coupling, transverse mode selection, and longitudinal mode selection.

The preferred embodiment of the invention includes methods, systems, devices and apparatus of a laser resonator having photo-thermo-refractive (PTR) volume diffractive elements which can be used in a laser emitting in the window of transparency of PTR glass comprising an external resonator including photo-thermo-refractive (PTR) volume diffractive elements whereby control of said laser's spectral and angular parameters is provided.

A resonator for a laser can include a photo-thermo-refractive (PTR) volume diffractive element having a high absolute diffraction efficiency to provide angular selectivity and spectral selectivity and a collimating optics for divergence of a radiation emitted from a gain medium, wherein said emitted radiation is directed toward said PTR volume diffractive element. The PTR volume diffractive element can include a transverse mode grating to provide said angular selectivity, wherein said transverse mode grating provides a significant difference in losses for the transverse mode gratings with adjacent numbers and said collimator provides divergence of said radiation, and can include a reflecting volume Bragg grating to provide said spectral selectivity, wherein said longitudinal mode grating is selected to provide significant difference in losses for longitudinal mode gratings with adjacent numbers and said collimating lens equalizes divergence of the laser beam along an orthogonal direction.

The resonator can further include a re-focusing element to provide further adjustment of a mode divergence and said angular selectivity, a dispersive element to provide sharpening of said spectral selectivity and a mirror for reflecting a complementary radiation back to said PTR volume diffractive element where the mirror can have a reflecting PTR Bragg grating with a reflection coefficient exceeding approximately 95%, and an absolute diffraction efficiency exceeds approximately 95%.

A volume Bragg laser emitting in a window of transparency of photo-thermo-refractive (PTR) glass having an absolute diffraction efficiency exceeding approximately 95% can include a lasing emitter for emitting a laser radiation and an external resonator including a photo-thermo-refractive (PTR) volume diffractive elements to provide control of at least one of a spectral parameter and an angular parameter of said laser radiation. The elements can include at least one high efficiency volume Bragg grating recorded in a photo-thermo-refractive (PTR) glass having an absolute diffraction efficiency exceeding approximately 95% in transmitting mode and reflecting mode for use in selection of a corresponding at least one of a transverse mode and a longitudinal mode and providing thermal stabilization.

The laser can include at least one transverse mode grating within said PTR glass to provide transverse mode selection and angular selectivity, with the grating having at least one longitudinal mode grating within said PTR glass to provide a longitudinal mode selection and a spectral selectivity, and at least one transverse mode grating within said PTR glass to provide transverse mode selection and an angular selectivity. The window of emission of the laser can have a transparency of said PTR glass that ranges from approximately 300 nm to approximately 3000 nm. The laser can be one of a solid state, semiconductor, liquid and gas laser. The semiconductor laser can be one of an edge emitting laser diodes, a vertical cavity surface emitting lasers (VCSELs), and a grating coupled surface emitting lasers (GCSELs).

A multi-channel Bragg resonator can include plural high efficiency volume Bragg gratings recorded in photo-thermo-refractive (PTR) glass having an absolute diffraction efficiency exceeding 95% in transmitting mode and reflecting mode for transverse mode and longitudinal mode selection and for thermal stabilization, and at least one reflective device to increase an output coupling efficiency. The grating can have at least one transmitting mode Bragg grating corresponding to each channel to provide angular selection in a direction perpendicular to an optical axis of a corresponding laser emitter, and/or at least one reflecting mode Bragg grating corresponding to each channel to provide spectral selectivity and a selection of an orthogonal transverse mode.

The plural high efficiency volume Bragg grating can include a first Bragg reflective Bragg grating that fumctions as an interchannel coupler to provide an exchange of radiation between said adjacent channels, and a second Bragg reflective grating to function as a mirror to reflect back a selected longitudinal mode and transverse mode. A multi-channel Bragg coupled chain laser can include a first and a second lasing emitter that emit a first and a second laser radiation and a volume Bragg gating in a photo-thermo-refractive (PTR) volume diffractive glass for one of an angular selectivity and a spectral selectivity to couple said first and said second laser radiation to produce a first output beam.

The laser can further include at least one next elementary emitter coupled with an adjacent one of said first elementary emitter and another one of said at least one next elementary emitter, a third and a fourth lasing emitter that emit a third and a fourth laser radiation, a volume Bragg gating in a photo-thermo-refractive (PTR) volume diffractive glass for one of an angular selectivity and a spectral selectivity to produce a next output beam, and wherein each of said at least one next elementary emitter couples said third and said fourth laser radiation and an adjacent one of said first output beam and said next output beam to generate a single output beam.

A multi-channel Bragg coupled laser can include at least two lasing emitters to provide a corresponding at least two laser beams, at least one photo-thermo-refractive (PTR) volume diffractive element to provide at least one of an angular selectivity and a spectral selectivity, wherein said multi-channel Bragg coupled laser emits at least one of a transverse mode and a longitudinal mode, respectively, which corresponds to said at least one of said angular selectivity and said spectral selectivity, and at least one reflective device to increase an output coupling efficiency, wherein said PTR volume diffractive element and said at least one reflective device couples said at least two laser beams to produce a single output laser beam.

The diffractive element can include at least one of a reflecting Bragg grating and a transmitting Bragg grating in a PTR volume diffractive glass to provide a corresponding one of said longitudinal mode selection and said transverse mode selection. The at least two lasing emitters can include at least two volume Bragg lasers, wherein the selection of the transverse mode and the longitudinal mode is determined by a summarization selectivity of said at least one photo-thermo-refractive (PTR) volume diffractive element and said at least two volume Bragg lasers. The at least two volume Bragg lasers can include a lasing emitter for emitting a laser radiation, and an external resonator including a photo-thermo-refractive (PTR) volume diffractive element to provide control of at least one of a spectral parameter and an angular parameter of said laser beam.

The external resonator can include a second photo-thermo-refractive (PTR) volume diffractive element having a high absolute diffraction efficiency to provide an angular selectivity and a spectral selectivity, and a collimating optics for divergence of a radiation emitted from said lasing emitter, wherein said emitted radiation is directed toward said second PTR volume diffractive element. The refractive device can include a Bragg mirror for reflecting complementary radiation back to said PTR volume diffractive element.

A multi-channel volume Bragg coupled laser having a single output laser beam can include plural lasers forming plural adjacent channels, each of said plural lasers producing a corresponding one of plural laser emission outputs, a photo-thermo-refractive (PTR) volume diffractive element for thermal stabilization, wherein said PTR volume diffractive element couples said plural laser emission outputs to produce a single output beam, and at least one collimating optical element between said plural lasers and said PTR volume diffractive element to provide adjustment between divergence of radiation and angular selectivity of gratings.

The diffractive element can include plural high efficiency volume Bragg gratings for coupling, said plural volume Bragg gratings in at least one of a transmitting mode and a reflecting mode for the selection of a corresponding one of an angular selectivity and a spectral selectivity. The plural gratings can include a first reflective Bragg grating that functions as an interchannel coupler to provide an exchange of radiation between adjacent ones of said plural adjacent channels, and a second reflective Bragg grating that functions as an output coupler to reflect back a portion of said single output laser beam of a selected one of said longitudinal mode.

The laser can include a transmitting Bragg grating for transverse mode selection to provide and angular selectivity, and a third reflective Bragg grating to optimize output coupling efficiency.

The plural lasers can be one of a solid state, semiconductor, liquid and gas laser, or are plural volume Bragg lasers.

Further objectives and advantages of this invention will be apparent from the following detailed description of the presently preferred embodiments which are disclosed in the following text and properties of which are illustrated in the accompanying drawings.

BRIEF DESCRIPTION OF THE DRAWINGS

FIG. 18a shows overlapped laser beams from two separate laser diodes with both diodes locked to a narrow band emission mode but are not coherent.

FIG. 18b shows overlapped laser beams from two separate laser diodes with the diodes coupled coherently producing stable interference fringes at 45 degrees.

FIG. 19 shows interference pattern and its profile.

DESCRIPTION OF THE PREFERRED EMBODIMENTS

Figure 1A:
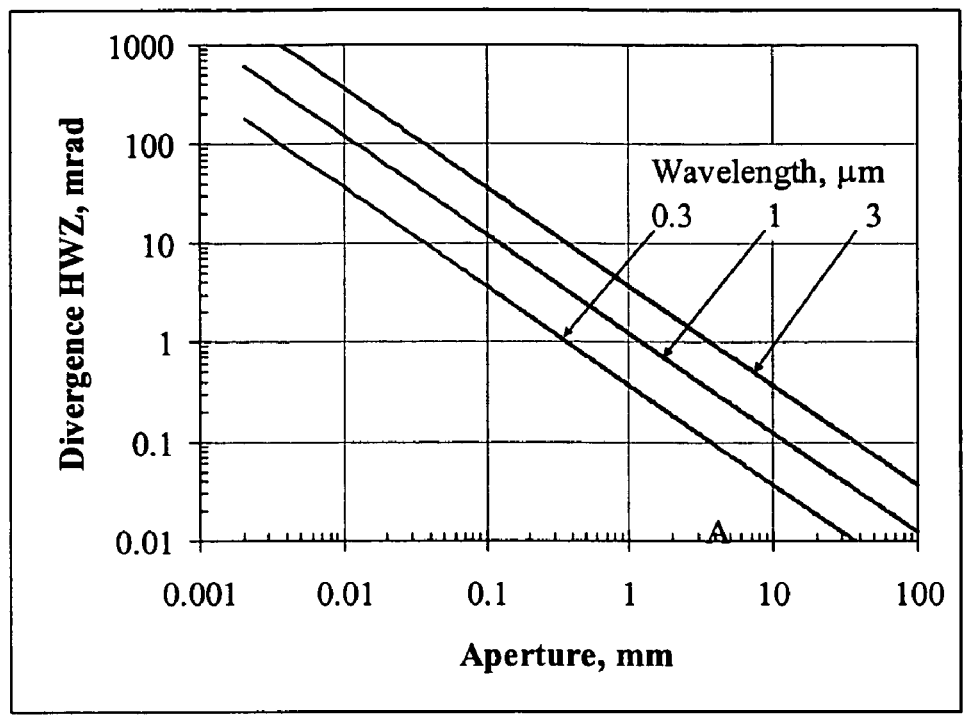
FIG. 1a is a graphical representation showing the divergence of laser beams.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of reference numerals used in the drawings and the detailed description of the preferred embodiment to identify components.

| | |
|---|---|
| 22 | Beam |
| 24 | Transmitting Bragg grating |
| 26 | Reflecting Bragg grating |
| 42 | Bragg grating |
| 43 | Diffracted radiation |
| 44 | Collimator |
| 45 | Gain medium |
| 46 | Bottom mirror |
| 48 | Top mirror |
| 49 | Output radiation |
| 60 | External resonator |
| 62 | Reflecting volume Bragg grating |
| 64 | Collimating lens |
| 65 | Gain medium |
| 70 | External resonator |
| 72 | Lens |
| 74 | Lens |
| 76 | Bragg grating |
| 100 | Multi-channel Bragg coupled laser |
| 122 | Bragg grating |
| 124 | Laser |
| 126 | Laser |
| 128 | Mirror |
| 130 | Output beam |
| 150 | Multi-channel Bragg chain laser |
| 152 | Bragg grating |
| 154 | Lasing emitter |
| 156 | Lasing emitter |
| 158 | Single output beam |
| 200 | Multi-channel Bragg coupled laser |
| 222 | Stack of Bragg gratings |
| 230 | Output beam |
| 300 | Multi-channel volume Bragg laser |
| 310 | First Bragg grating |
| 315 | Second Bragg grating |
| 320 | Laser emitters |
| 325 | Collimating optics |
| 330 | Output Beams |
| 400 | Multi-channel volume Bragg laser |
| 405 | First Bragg grating |
| 410 | Second Bragg grating |
| 415 | Third Bragg grating |
| 420 | Laser emitters |
| 455 | Multi-channel aperture |

Control of the spectral and angular parameters of single lasers, bars and stacks are required to overcome the difficulties of the prior art that limits the use of lasers. The present invention provides a method, apparatus, system and device using external resonators including photo-thermo-refractive (PTR) volume diffractive elements to achieve the required control. The present invention can be applied to all types of lasers including solid state, semiconductor, liquid, and gas that emit in the window of transparency of PTR glass which covers near UV, visible and near IR spectral regions. Different types of semiconductor lasers, such as edge emitting laser diodes, vertical cavity surface emitting lasers (VCSELs), and grating coupled surface emitting lasers (GCSELs) can be improved with use of external Bragg resonators. according to the present invention.

The present invention uses the diffractive optical elements from photosensitive photo-thermo-refractive (PTR) glass with an absolute diffraction efficiency exceeding 95% for producing volume Bragg lasers and multi-channel volume Bragg lasers. The volume Bragg gratings are used for transverse and longitudinal mode selection in laser resonators with surprisingly advantageous results. The present invention is used to produce a number of laser devices with narrow spectral and angular distribution of radiation.

The fabrication of high efficiency volume diffractive gratings in PTR glass is fully described in U.S. Pat. No. 6,586,141 B1, issued to Efimov et a. on Jul. 1, 2003 entitled Process for production of high efficiency volume diffractive elements in photo-thermo-refractive glass and the use of those gratings for optical radiation control is described in U.S. Pat. No. 6,673,497 issued on Jan. 6, 2004 entitled High efficiency volume diffractive elements in photo-thermo-refractive glass. Both of these referenced patents are assigned to the same assignee as the present invention and are fully incorporated herein by reference hereto.

It is a problem in laser design to create a reliable small size single transverse mode laser which provides diffraction limited divergence. A conventional method for a single transverse mode selection is increasing of the aspect ratio (length/aperture) of a resonator to provide a single Fresnel zone on an output mirror. Actually, this means limiting the maximum angle of light propagation in a resonator. However, there are no conventional optical elements that provide selection in angular space. Therefore, the conventional method of increasing the aspect ratio of the resonator leads to increasing a length of a resonator which increases the weight of the laser. Another prior art method disclosed use of the angular selectivity of Bragg gratings for transverse mode selection however, this prior art method was not successfully realized because of the absence of volume diffractive gratings with high diffraction efficiency and high resistance to laser radiation. Thus, this was realized in the U.S. Pat. No. 6,673,497 patent with PTR volume Bragg gratings which enable creation of more effective lasers with higher power and brightness and reduced size and weight.

Selection of Transverse Modes

Transverse modes with different numbers have different angular distributions of their emission. The absence of optical elements which provided efficient selection of radiation in angular space led to the use of existing selective elements working in geometrical space (slits or diaphragms) in the far field of radiation. This approach could be achieved by increasing of the length (aspect ratio) of resonator or conversion from angular distribution to space distribution by focusing elements. Because of their strong angular selectivity, volume Bragg gratings provide mode selection directly in angular space or in space of wave vectors. In other words, the transmitting volume Bragg grating functions as a slit and the reflecting volume Bragg grating functions as a diaphragm in angular space. The present invention allows defining of a basic principle of a single mode volume Bragg resonator design that matches the direction of the propagation and angular divergence of any particular mode that should be selected with the angle of incidence and angular selectivity of a volume Bragg grating placed in a resonator.

Figure 1B:
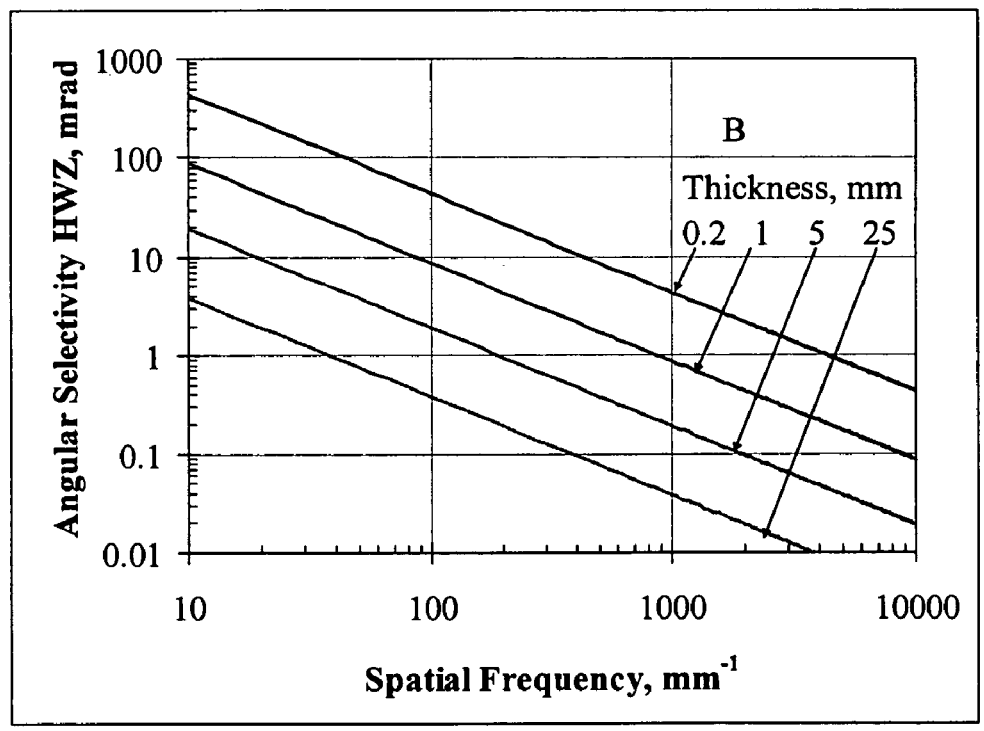
FIG. 1b is a graphical representation showing the annular selectivity of Bragg gratings.

Minimum possible divergence of radiation is determined by diffraction at the aperture. Dependence of divergence on the aperture for different wavelengths from near UV to near IR is shown in FIG. 1a. While the aperture increases from a micron to hundreds of millimeters, beam divergence decreases from hundreds of milliradians (tens of degrees) to tens of microradians. FIG. 1b shows that thick Bragg gratings can provide angular selectivity in the whole region of angles which are shown in FIG. 1A. This means that a proper choice of Bragg grating allows matching of its angular parameters with beam divergence and provides effective selection of transverse modes without any restrictions for the aspect ratio of the resonator. The preferred embodiments of this invention is the use of PTR volume Bragg gratings as elements in laser resonators to provide high diffraction efficiency, low losses, and wide variety of spatial frequencies and thicknesses. Use of the volume Bragg gratings in the laser resonator defines the novel laser by the name volume Bragg laser (VOBLA).

Figure 2A:
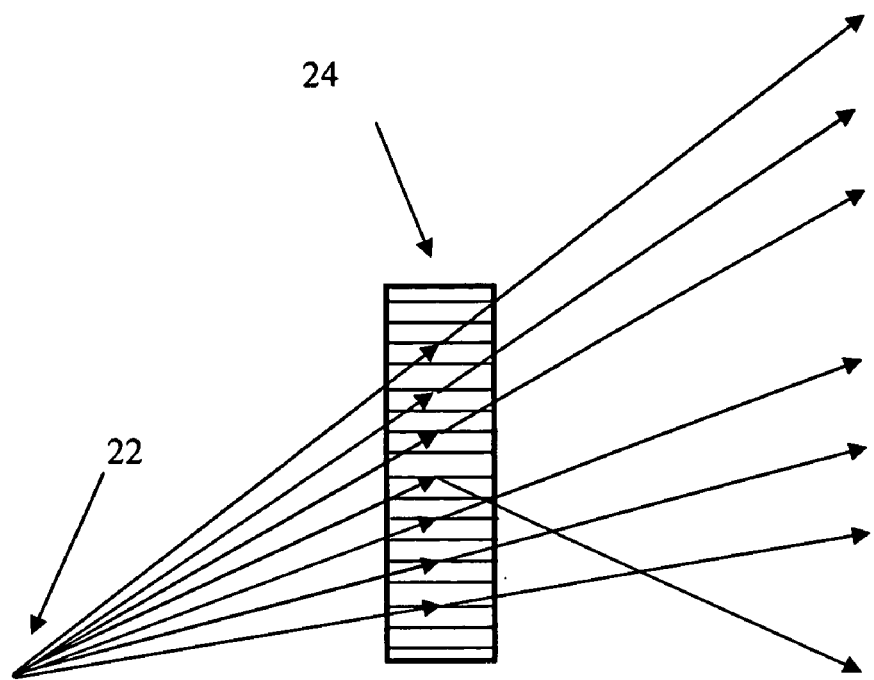
FIG. 2a shows the result of a transmitting Bragg grating as a slit in angular space.

The efficiency of coupling by use of volume Bragg grating in the laser resonator is determined by both the value of its diffraction efficiency and relationship between divergence of radiation and angular selectivity of the grating. FIG. 2a shows that for a divergent (or convergent) beam 22, transmitting grating 24 has sharp angular selectivity in the plane of drawing and a flat angular selectivity in the plane perpendicular to the plane of drawing. Therefore, the transmitting grating 24 functions as a one-dimensional soft diaphragm (or slit) which can cut off a portion of incident radiation even if it is a single mode one.

Figure 2B:
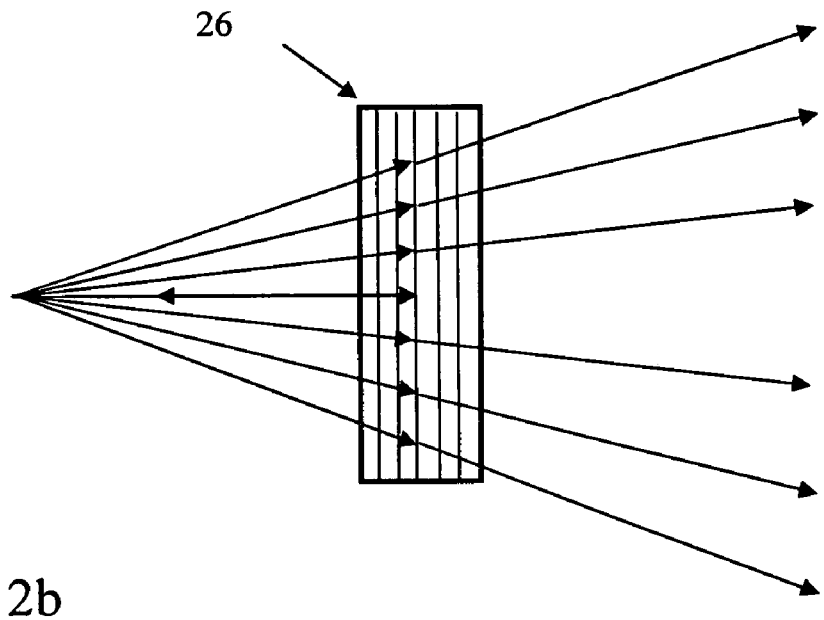
FIG. 2b shows the result of a reflecting Bragg grating as a diaphragm in angular space.

As shown in FIG. 2b, reflecting Bragg grating 24 works as a soft two-dimensional diaphragm for a nonplanar beam. The diameter of a diffracted beam increases if divergence of the beam, or spatial frequency and thickness of a grating, decreases. The reflecting Bragg grating can be used as an output element in telescopic resonator and can provide feedback for part of a mode only, while the rest of the radiation would travel through the grating.

Figure 3A:
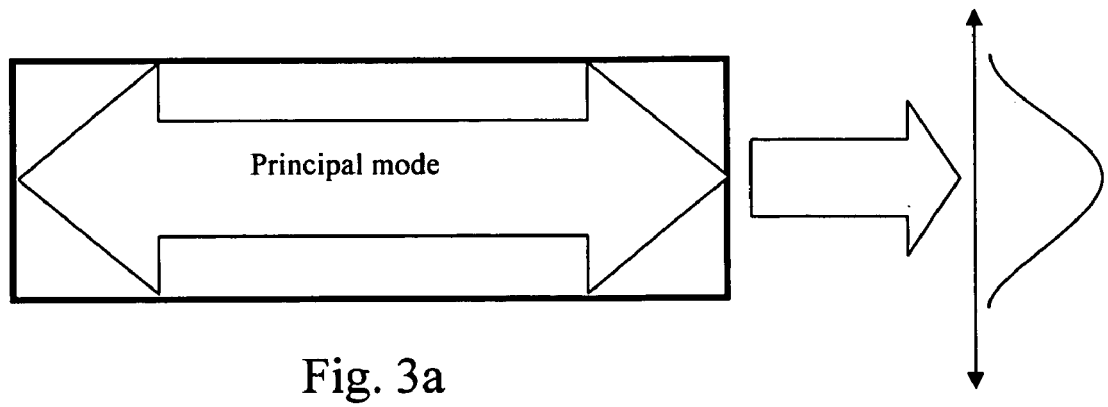
FIG. 3a shows the beam propagation and angular distribution of emission for the principal (zero-order) mode.
Figure 3B:
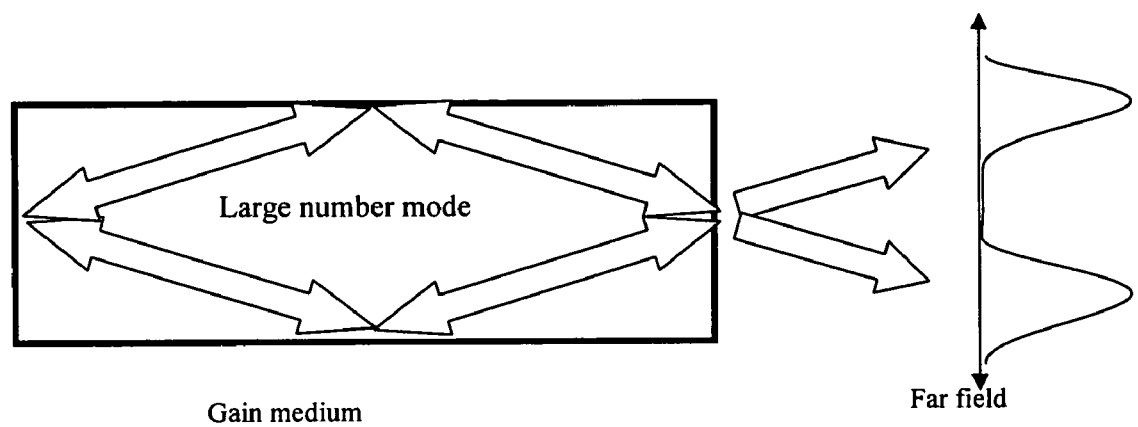
FIG. 3b shows the beam propagation and angular distribution of emission for the selected mode with a larger number (high-order mode).

Conventional methods for transverse mode selection typically selects elements which increase losses for higher numbered modes because in most cases, a zero mode originally has lowest losses and highest gain. As shown in FIG. 3A, the principle mode propagates along the axis of a resonator and has a single main maximum in far field. The principle mode can be selected by use of a diaphragm which cuts off peripheric rays having higher intensities for higher modes or by use of an output coupler with Bragg gratings that has cut off-axis rays having higher intensities for higher numbered modes. This example works well for relatively long resonators with an aspect ratio (length/aperture) that typically exceeds several hundreds. For resonators with an aspect ratio in the range from approximately several unities to approximately several tens, the highest gain is achieved for higher numbered modes having several maxima in far field as shown in FIG. 3B. In the second example, the ability of the volume Bragg grating to select radiation in angular space allows for selection of any arbitrary transverse mode by selecting the appropriate volume Bragg grating and by proper alignment of the chosen volume Bragg grating.

There are alternative methods for matching angular parameters of a selecting mode and a selective volume Bragg grating in a resonator. For example, a variety of focusing devices with lenses or mirrors provide different magnification and, therefore, varying angular divergence of radiation and provide a desirable difference in losses for selecting modes.

Figure 4A:
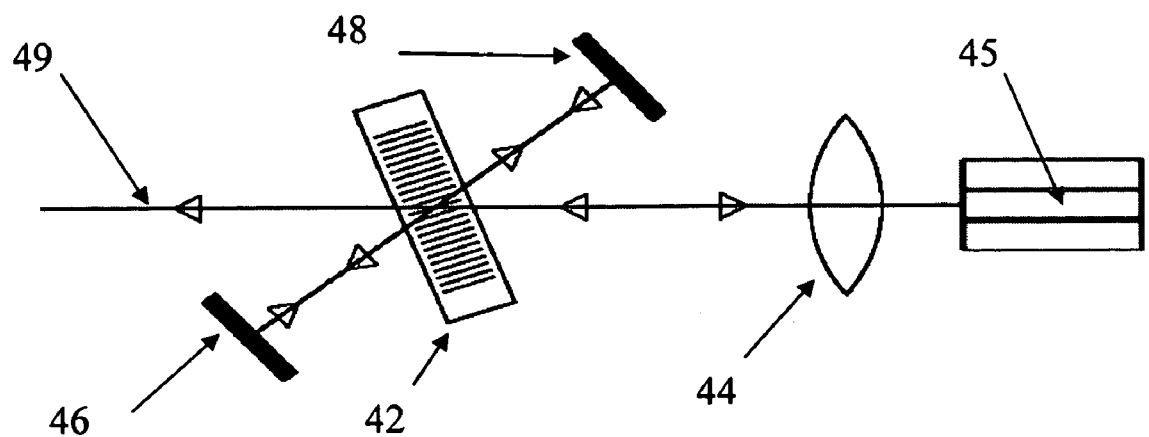
FIG. 4a shows the beam propagation for a zero-order transverse mode selected by transmitting Bragg grating in a complex resonator with two mirrors.

FIG. 4a is a diagram showing a basic design of laser resonator for principal transverse mode including gain medium with back mirror 45, collimator 44, transmitting Bragg grating 42, and mirrors 46 and 48. This design produces angular selection in a direction perpendicular to an optical axis of the laser. Collimator 44 provides matching of natural divergence of radiation emitted from a gain medium 45 and angular selectivity of a Bragg grating 42. In a preferred embodiment of the invention, the volume Bragg grating has a high diffraction efficiency exceeding approximately 95%. The Bragg grating is adjusted for total diffraction of some wavelengths as shown by the arrows. Lower mirror 46 reflects radiation back to the Bragg grating 42 and further to resonator for the next round of amplification. As a result, the resonator has a high Q-factor only for transverse modes within the spectral and angular selectivity of the Bragg grating 42. The coupling efficiency is approximately 100% and the radiation is retained within the resonator.

Figure 4B:
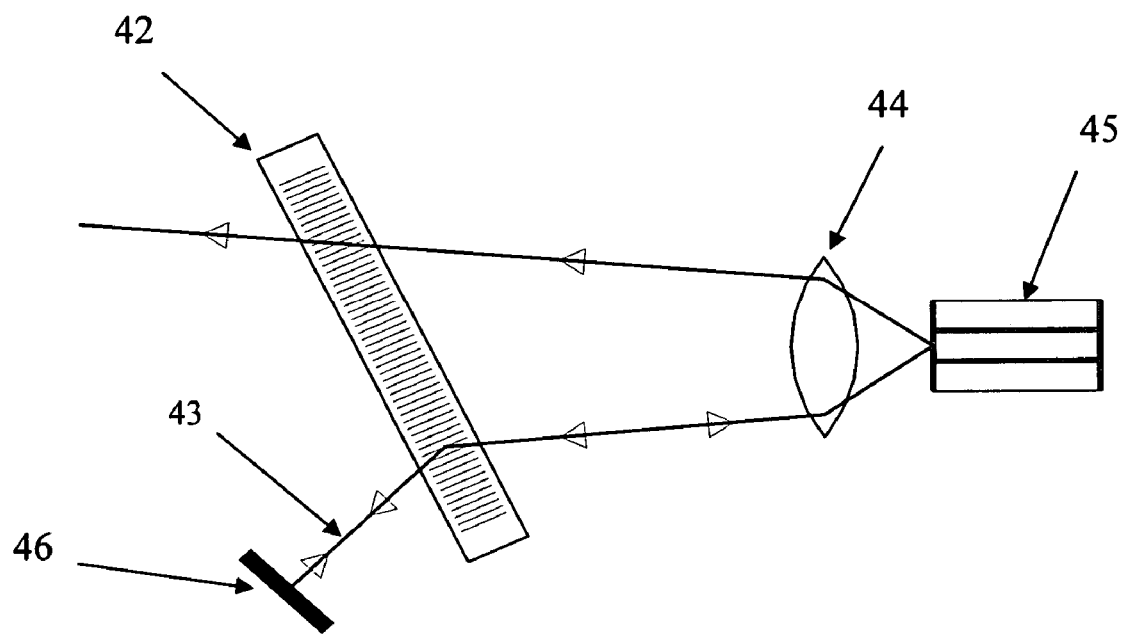
FIG. 4b shows the beam propagation for a high-order transverse mode selected by transmitting Bragg grating.

Rotation of the Bragg grating 42 causes a decrease in diffraction efficiency and propagation of radiation out of the resonator and through the Bragg grating 42 as shown by the upwardly directed arrows to the top mirror 48. Reflection from the top mirror 48 contributes to the output radiation 49 and to feedback. The resonator shown in FIG. 4b provides gradual variation of coupling efficiency for particular wavelengths within the gain contour of a medium 45 and can be effectively used for optimization of coupling efficiency for different types of lasers.

Rotation of the mirrors 46 and 48 shifts the resonant wavelength. A consequent adjustment of the Bragg grating 42 provides optimal coupling efficiency for each wavelength. Therefore, the volume Bragg laser configuration shown in FIG. 4 provides gradual selection of wavelengths and coupling efficiency for transverse modes in the plane of diffraction. This configuration is effective for lasers with strong asymmetry of radiation, e.g. for semiconductor lasers.

A second Bragg grating, such as a longitudinal mode grating, can be adjusted for angular distribution of radiation in the perpendicular plane and provide selection of orthogonal transverse modes. In this embodiment, the transverse mode and longitudinal mode gratings are provided in the PTR volume Bragg diffractive element. FIG. 4A shows alignment of the transmitting Bragg grating 42 for zero, or principle mode. However, the transmitting Bragg grating 42 can be rotated to select an alternative transverse mode of the resonator as shown in FIG. 4b, wherein the transmitting Bragg grating is rotated to select a higher numbered transverse mode. For the higher numbered transverse modes having more than one maximum in angular distribution of radiation, the transmitting Bragg grating is adjusted to one of the directions. Diffracted radiation 43 is reflected back by a mirror 46 which can be a conventional wide band mirror or a resonant Bragg mirror. When the resonant Bragg mirror is used, additional spectral selection occurs. Use of the wide band mirror provides a device that is tunable in the same manner as the resonator shown in FIG. 4a.

Figure 5:
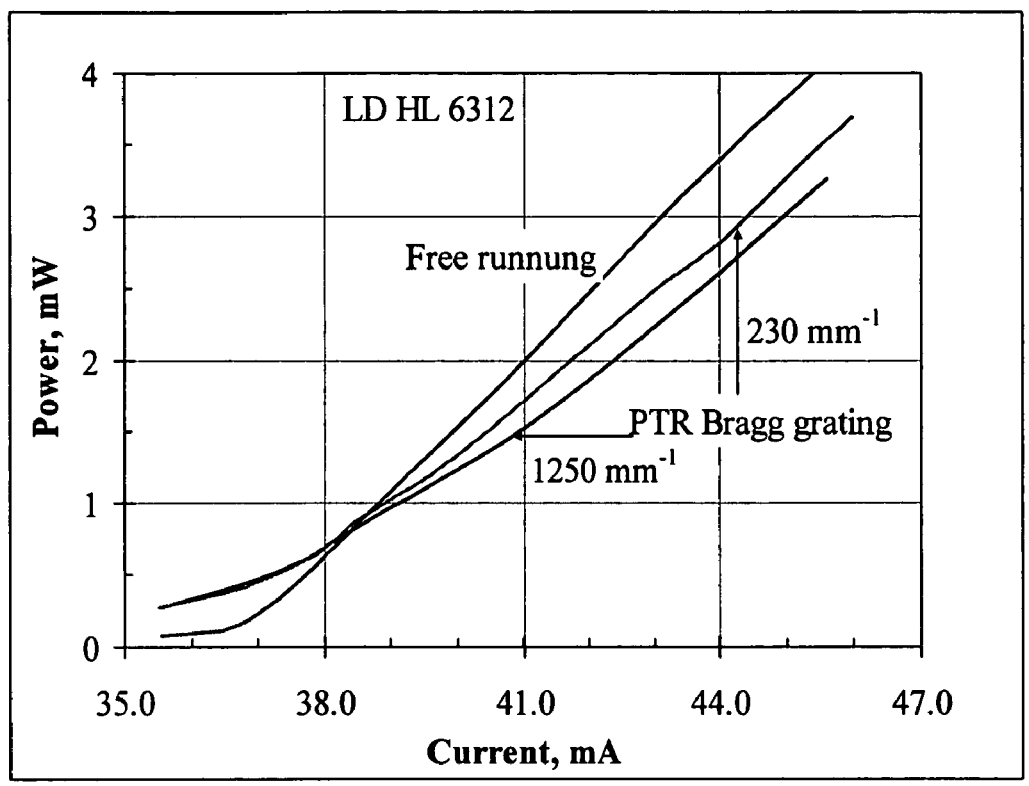
FIG. 5 shows the dependence of output power of Bragg lasers with different spatial frequencies of transmitting Bragg gratings.

FIG. 5 is a graph showing the dependence of output power of a single mode laser diode in comparison to a volume Bragg laser using a transmitting Bragg grating as shown in FIG. 4a. The single mode laser diode had a coating at the front facet that was optimized for maximum output power at maximum current. Additional feedback provided by the transmitting Bragg grating resulted in increasing of output power for low currents and decreasing of power at maximum current by approximately 20%. This decrease in power at maximum current results from the absence of antireflecting coatings at the PTR Bragg grating and too high of a coupling efficiency which is, however, necessary to keep the laser emitting an alternative mode instead of its original resonator that was produced by mirrors at back and front facets of a laser diode.

Figure 6:
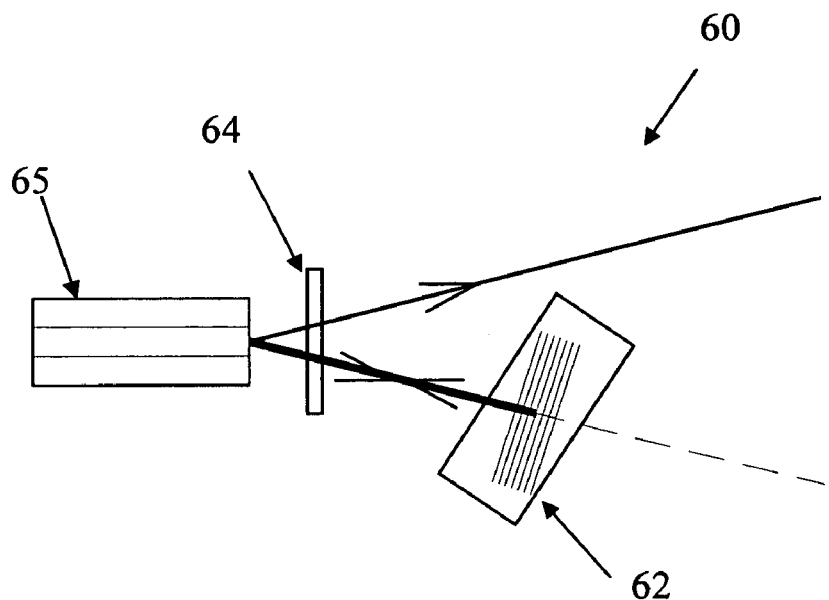
FIG. 6 shows a volume Bragg Laser with a total back mirror grating after collimation along one axis.
Figure 7:
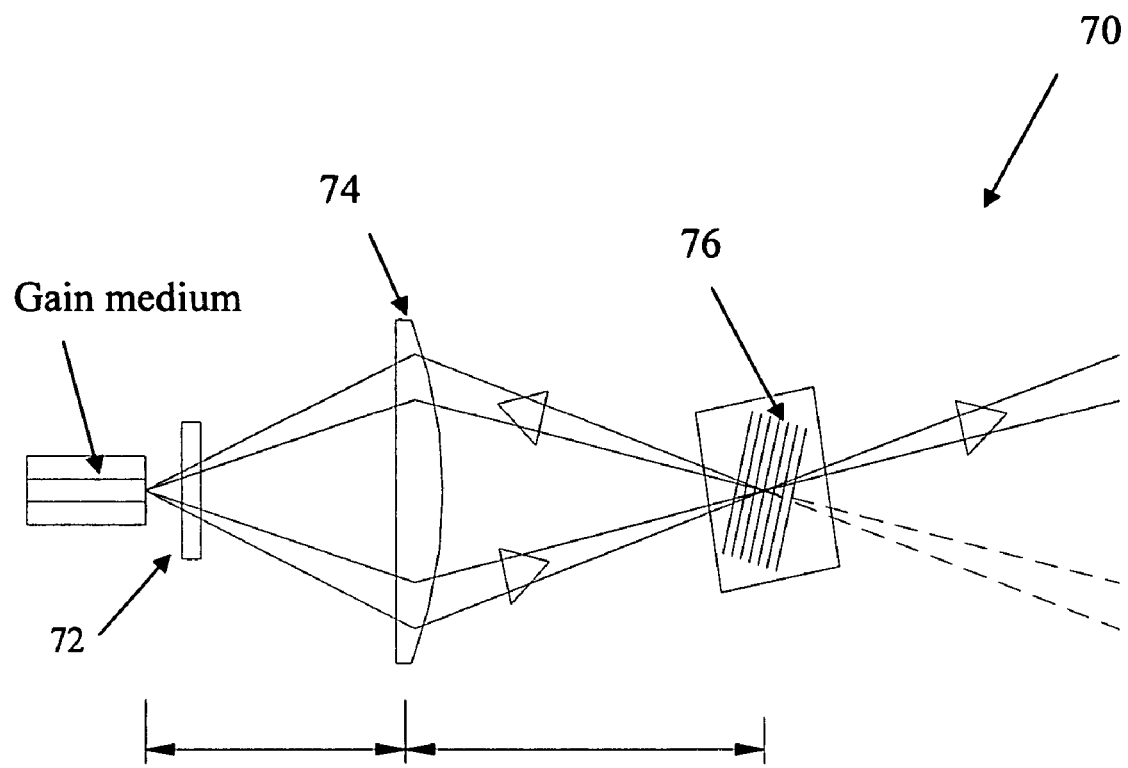
FIG. 7 shows a volume Bragg laser with collimation along the fast axis and angular magnification along the slow axis in external resonator with reflecting Bragg grating.

FIG. 6 is a diagram of an external resonator 60 with a reflecting volume Bragg grating 62 used as a total back mirror. The collimating lens 64 eliminates high divergence of the laser beam from the gain medium 65 along the orthogonal direction. The angular selectivity of the Bragg grating 62 is matched to the divergence of a selected transverse mode and by proper alignment to direct the radiation back to the resonator 60. Complementary radiation of this transverse mode is out of the angle of acceptance by the Bragg grating 42 and therefore, the complementary radiation transmits through the Bragg grating. To increase coupling efficiency, an additional Bragg grating partially reflecting the second branch of a transverse mode could be recorded in the same glass blank to provide additional reflection back to the resonator. FIG. 6 shows alignment of a Bragg grating 62 for large numbered off-axis transverse mode. However, the Bragg grating can be tuned to any transverse mode of the resonator. Additional adjustment of the mode divergence and Bragg grating selectivity can also be achieved by using one or more additional re-focusing elements in the resonator 70 as shown in FIG. 7. For such design, divergence of the mode radiation is inversely proportional to magnification of the focusing system which is illustrated as lens 72 and lens 74. The resonator shown in FIG. 7 is convenient for use in experiments because if allows adjustments of the laser and the Bragg gratings 76 in a wide range of angles with the use of the same components.

Figure 8:
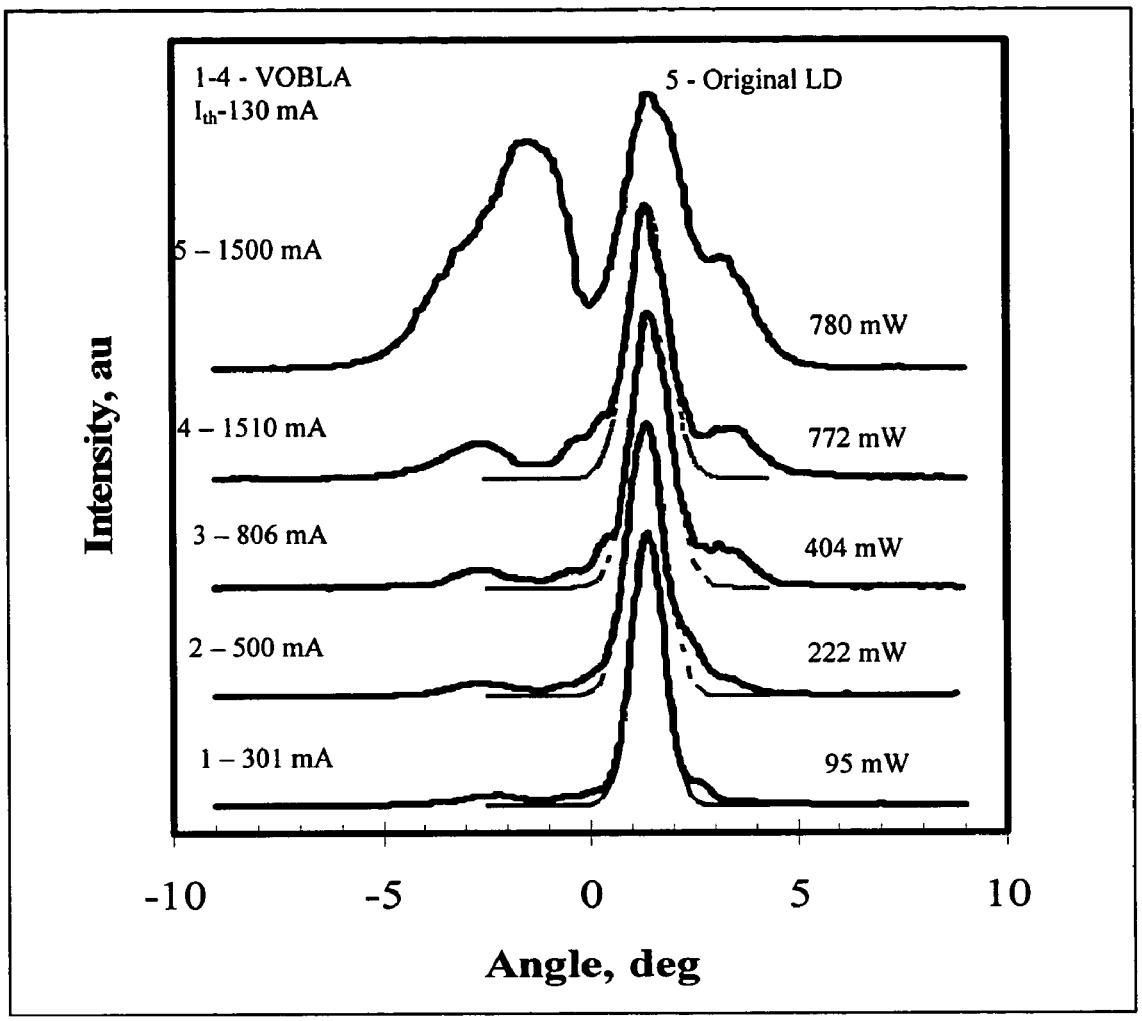
FIG. 8 shows far field pattern for volume Bragg laser with reflective volume Bragg grating at different levels of pumping.

The far field pattern resulting from use of a reflecting PTR Bragg grating in the external resonator shown in FIG. 7 is graphically shown in FIG. 8. The thin lines in FIG. 8 show the theoretical profiles of diffraction limited divergence. The external resonator with reflecting PTR Bragg grating 76 provides angular selectivity of output radiation close to the diffraction limit even at high levels of pumping that exceed a threshold for more than 10 times. This result indicates that a wide stripe laser diode operates in a single mode regime emitting almost 1 W radiation with $M^2=1.7$. The method, apparatus, system and device of the present invention can be applied to different types of lasers providing single-transverse-mode operation with diffraction limited divergence for resonators having high Fresnel numbers and therefore naturally supporting a large number of transverse modes.

Thus, the use of thick Bragg grating with angular selectivity adjusted to divergence of any desirable transverse mode, zero or high numbered, the laser resonator enables single mode operation for lasers with wide resonators. This adjustment can be provided by parameters of Bragg grating and by proper design of optics with different magnification.

Spectral Narrowing, Tuning and Stabilization

Typically, placing a dispersive element in a laser resonator results in narrowing of gain spectra and, therefore, in emitting a narrower line. However, the use of high efficiency PTR Bragg gratings in a preferred embodiment of the invention provides both angular and spectral selectivity.

Figure 9:
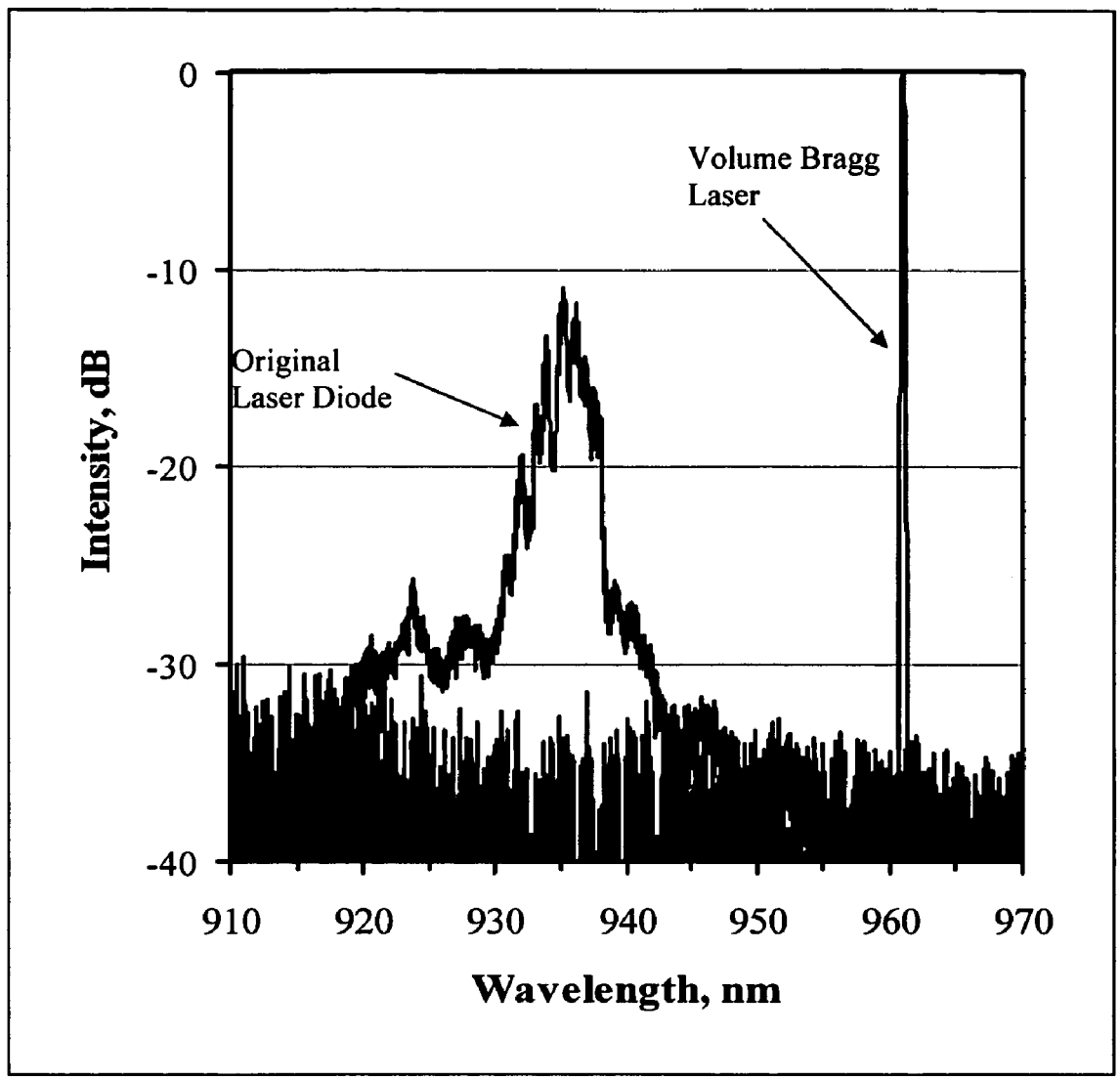
FIG. 9 shows emission spectra of original laser diode and volume Bragg laser with excessive pumping.

FIG. 9 shows a comparison of the emission spectra of an original laser diode and a volume Bragg laser according to the present invention, wherein the volume Bragg laser includes use of a PTR Bragg mirror that has a reflection coefficient exceeding 95% in an external resonator 70, as shown in FIG. 7, with a pumping current of approximately 1525 mA. As shown, although the pumping level exceeds threshold for more than 10 times, a single emission line is emitted. The spectral width of the emission line can be achieved in the range from approximately 50 to approximately 70 pm. Side lobes, or doubling of emission lines, is not observed at an intensity of approximately 35 dB. Advantages of high efficiency Bragg grating use includes simultaneous selection of transverse mode, narrowing of the emission line, and keeping output power at an approximately constant level, which results in increasing the brightness by several orders of magnitude. The prior art use of diffractive gratings with low efficiency required additional elements in the resonator to achieve a comparable performance.

Figure 10:
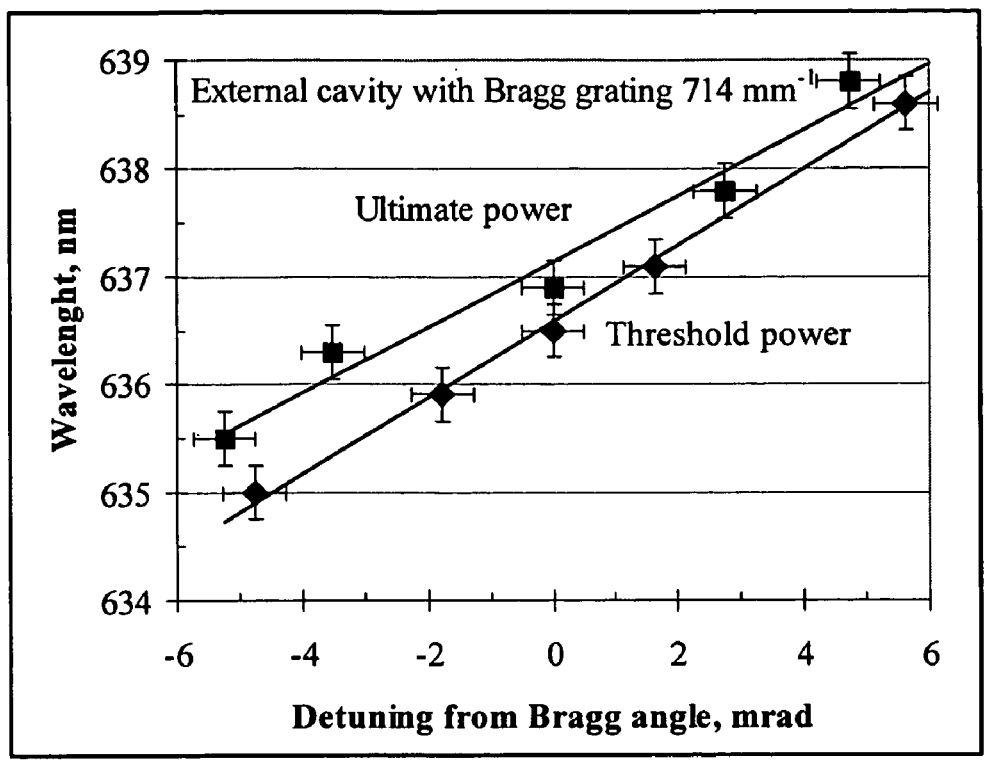
FIG. 10 shows tuning of wavelength of a single mode semiconductor laser for 3 nm produced by fine turning of transmitting grating and mirrors.

In an embodiment, transmitting Bragg gratings are used to achieve similar results. Transmitting Bragg gratings have a lower spectral selectivity. However, use of the geometry shown in FIG. 4a allows tuning of the wavelength emitted by the laser diode. FIG. 10 shows tuning the wavelength of a single mode semiconductor laser to approximately 3 nm by fine turning of the grating and the mirrors. Tuning is also applicable to semiconductor lasers with internal resonators produced by coatings at the back and the front facets. Optimization of coupling efficiency allows conversion of simple laser diodes into tunable laser diodes with minimal loss in output power. The use of laser diodes with efficiency AR coating at the front facet allows tuning that exceeds 50 nm.

Figure 11:
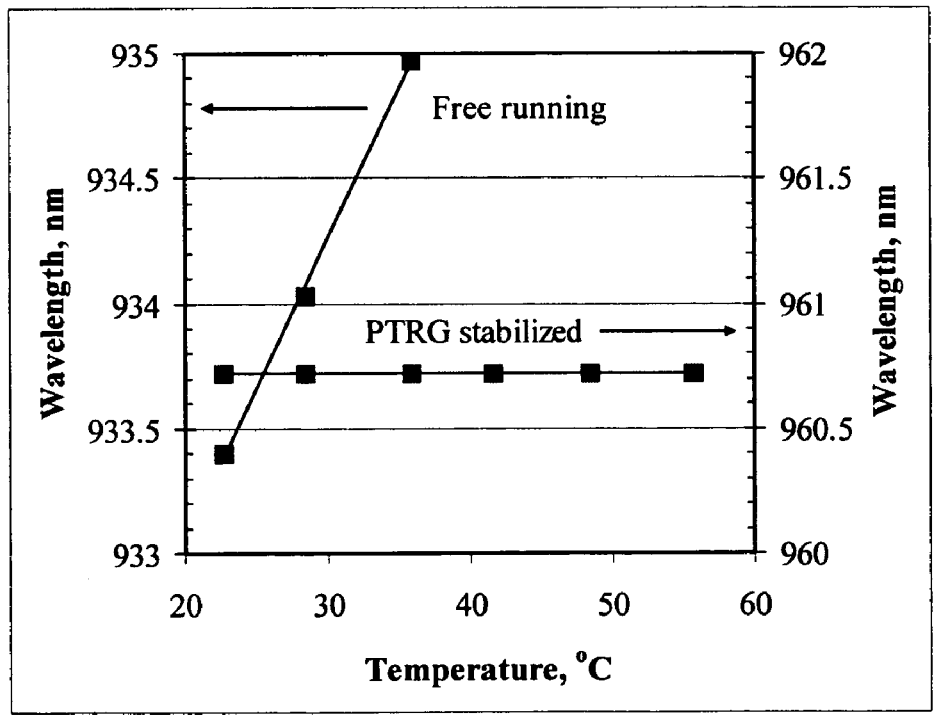
FIG. 11 shows the stability of the resonant wavelength of a volume Bragg laser with reflecting Bragg grating in a collimated beam.

Another advantage of volume Bragg grating use in a laser resonator is stabilization of output wavelength. While optical parameters of a gain medium of the prior art can be changed by intensive optical or electrical pumping (heating, free charges generation, etc.), the resonant wavelength of an external Bragg grating is stable and therefore, the emission line is stable within the gain contour of a medium. An example of such stabilization is shown in FIG. 11. As shown, the emission spectrum of the volume Bragg laser is stable within 100 pm in temperature range of 25 K. As shown, this stabilization occurs at approximately 50 K heating of the laser. The low absorption coefficient of the PTR glass results in the absence of heating of the PTR grating at maximum power of the laser diode. Moreover, the natural thermal shift of the resonant wavelength of the PTR Bragg grating is 7 pm/K. Therefore, even when the Bragg grating according to the present invention is attached to the laser, the thermal shift of the wavelength is small.

Multi-channel Volume Bragg Lasers

Increasing the brightness of a laser system requires increasing the power while maintaining the spectral width and angular divergence. To prevent damage to the optical elements of the laser system, the aperture is increased to achieve the increased output power. However, increasing the aperture leads to multimode oscillation and, therefore, decreases the brightness. A conventional solution to the problem uses phased arrays of single mode lasers which are coupled with mechanisms to allow leakage of radiation between channels. However, the solution creates other problems such as thermal and nonlinear distortions of the complex resonators and an absence of effective mode control.

Figure 12:
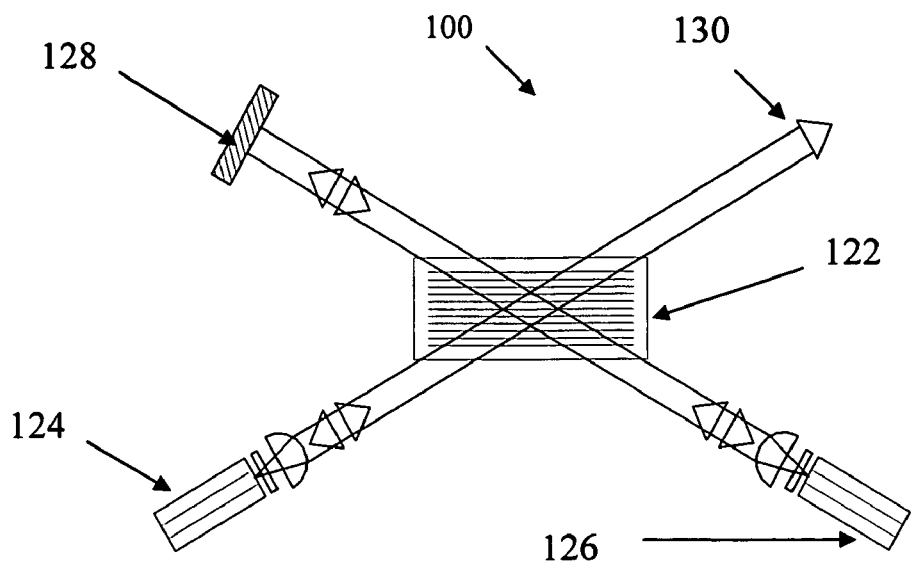
FIG. 12 shows the simplest Bragg coupled laser wherein the Bragg grating is shown as a reflective one.

The method, apparatus, system and device of the present invention is based on the use of high efficiency volume Bragg gratings which simultaneously provides coupling between channels, output coupling, transverse mode selection, and longitudinal mode selection. FIG. 12 shows an example of an elementary cell of a multi-channel Bragg coupled laser 100 with a single output beam 130 according to the present invention. Bragg grating 122 is shown as a reflective grating. A transmitting grating can be substituted to provide the same functions, however, the spectral selection would be smeared and the angular selection would be sharpened. Individual lasers 124 and 126 in FIG. 12 are shown as semiconductor volume Bragg lasers although alternative types of lasing emitters can be substituted in this configuration. The configuration shown in FIG. 12 couples emitters by partial diffraction of a Bragg grating 122 and a mirror 128 (conventional or Bragg) to increase the output coupling efficiency. This bi-channel volume Bragg laser only emits transverse and longitudinal modes which correspond to angular and spectral selectivity of coupling Bragg gratings. The elementary emitters are volume Bragg lasers, wherein the total selection of modes is determined by a summarized selectivity of the dispersive elements. For different gain and loss coefficients in different laser systems, optimum output coupling is different. If necessary, an additional partially reflecting Bragg mirror can be placed in the output beam.

Figure 13:
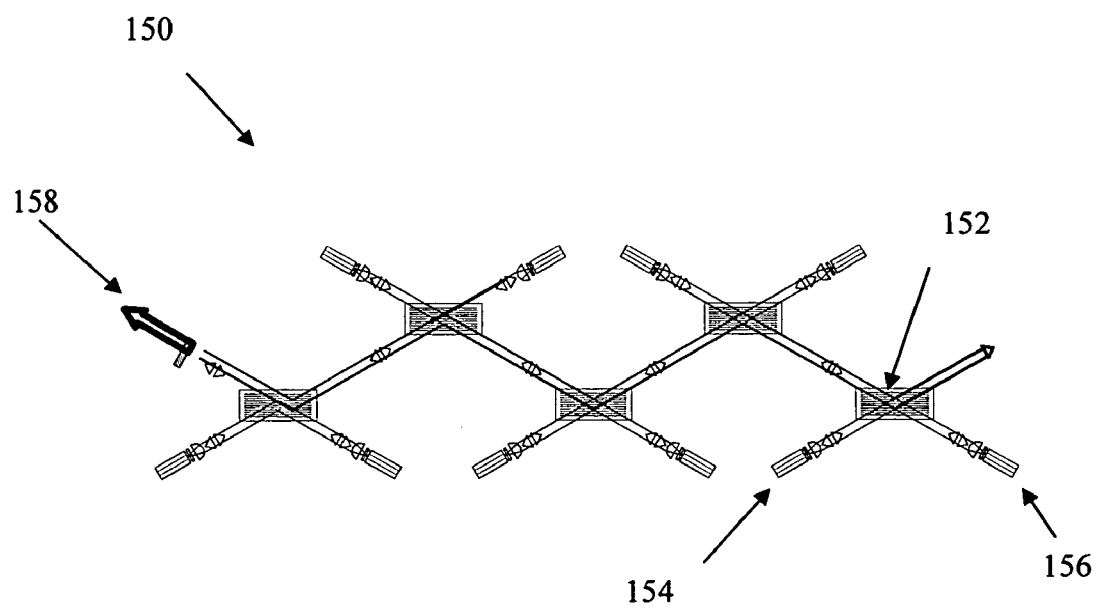
FIG. 13 shows the Bragg coupling used for chain lasers with multiple coupling gratings.

In an embodiment, the Bragg coupling allows designing the chain lasers with multiple coupling gratings as is shown in FIG. 13. This configuration uses a number of volume Bragg lasers, or alternative lasers, to produce the single output beam. For example, the multi-channel Bragg coupled chain laser 150 shown in FIG. 13 includes plural elementary cells, such as the cell containing lasers 154 and 156 and Bragg grating 152, coupled with an adjacent elementary cell, to produce a single output laser beam 158. This geometry can be infinitely extended in different directions. The natural limitation for this configuration is increasing of power density in an output channel and actual increasing of coupling efficiency with increasing of a number of elementary emitters in the system. However, this configuration is useful for media with low gain coefficients because it completely solves the problem of heat sink. In the case of high gain media, a number of branches can be open for output radiation. The device in this embodiment also works as a synthesized aperture.

Figure 14:
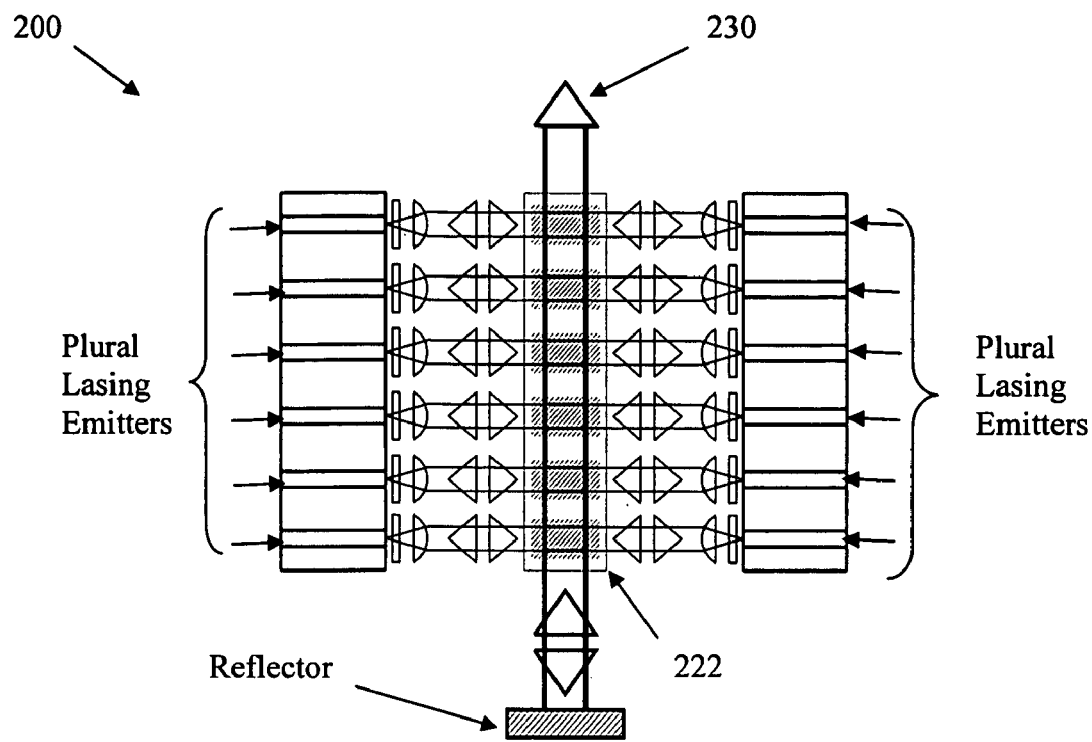
FIG. 14 shows a more compact and reliable design with the use of semitransparent Bragg gratings for coupling.

In another embodiment, a more compact and reliable multi-channel volume Bragg laser 200 design with use of semi-transparent Bragg gratings 222 for coupling plural lasing emitter outputs is shown in FIG. 14. Placing a number of Bragg gratings 222 in the same PTR glass blank provides efficient coupling between channels and robust alignment of the entrance beam and produces a single output beam 230. As previously discussed, this approach with 50% coupling is beneficial for laser systems with low gain coefficient and for a limited number of channels for a medium with high gain coefficient. However, the use of a Bragg grating stack 222 with different duty cycles up to 100% and with different diffraction efficiencies which allows effective coupling between different numbers of channels and, therefore, provides optimization for different gain coefficients and geometry of different laser media.

Figure 15:
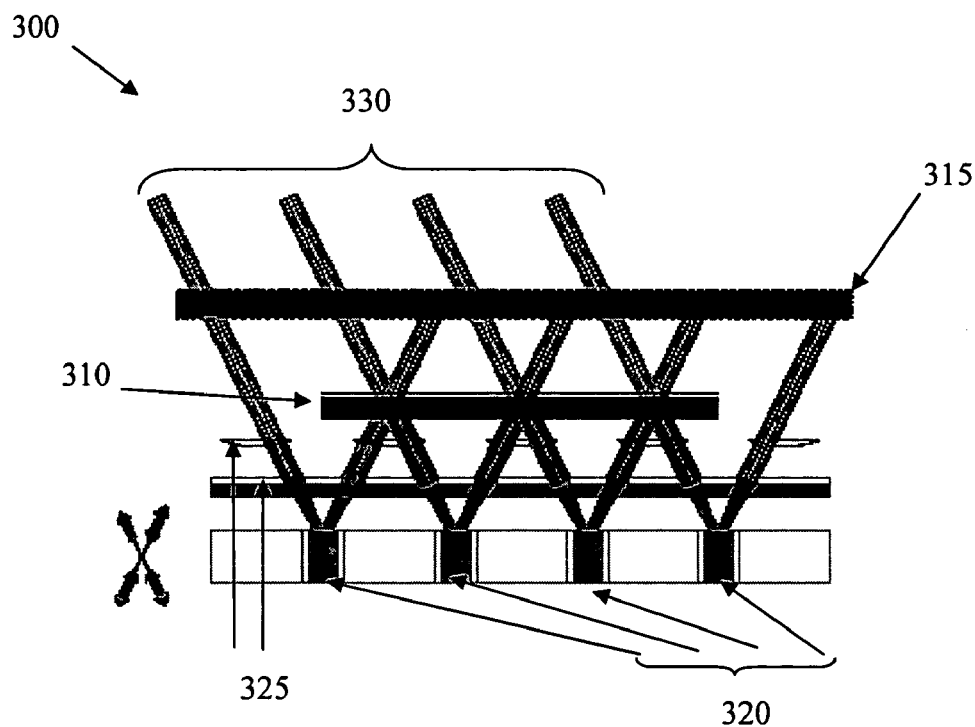
FIG. 15 shows a design of a multichannel laser system with wide aperture where the first grating is a Bragg mirror serving as an interchannel coupler providing exchange of radiation between the adjacent channels while the second one works as an output coupler for all channels.

In another embodiment, the multi-channel volume Bragg laser includes adjustable coupling efficiency between adjacent channels. In this embodiment, high order transverse modes which have off-axis emission to separate functions of interchannel coupling and output coupling are used. FIG. 15 shows a multi-channel laser system 300 with wide aperture where the first Bragg reflective grating 310 is a Bragg mirror that functions as an interchannel coupler to provide an exchange of radiation between the adjacent channels of laser emitters 320. A collimating optics 325 is provided between the laser emitters 320 and the first Bragg grating 310 to provide adjustment between divergence of radiation and angular selectivity of gratings. An incident angle for the mirror is equal to the emission angle of a selected transverse mode. In this example, the reflected portion of radiation is directed to the adjacent channel 320 and vice versa. The reflection coefficient for the mirror is optimized for each particular laser to provide maximum output power. The second Bragg reflective grating 315 has an approximately 100% reflection coefficient and functions as the back mirror in a conventional resonator reflecting back the only selected transverse and longitudinal modes. For lasers having a high gain coefficient, e.g. semiconductor lasers, an additional output coupler is not required. However, for laser systems with relatively low gain coefficient, an additional Bragg mirror with optimized reflection should be placed to output beams. It is important to note that all these gratings can be recorded in the separated wafers of PTR glass or in the same volume of a single glass plate depending on requirement for their parameters. Number and consequence of gratings would depend on a particular geometry and gain parameters of a laser. In this design both interchannel and output couplers provide both angular and spectral selection.

Figure 16:
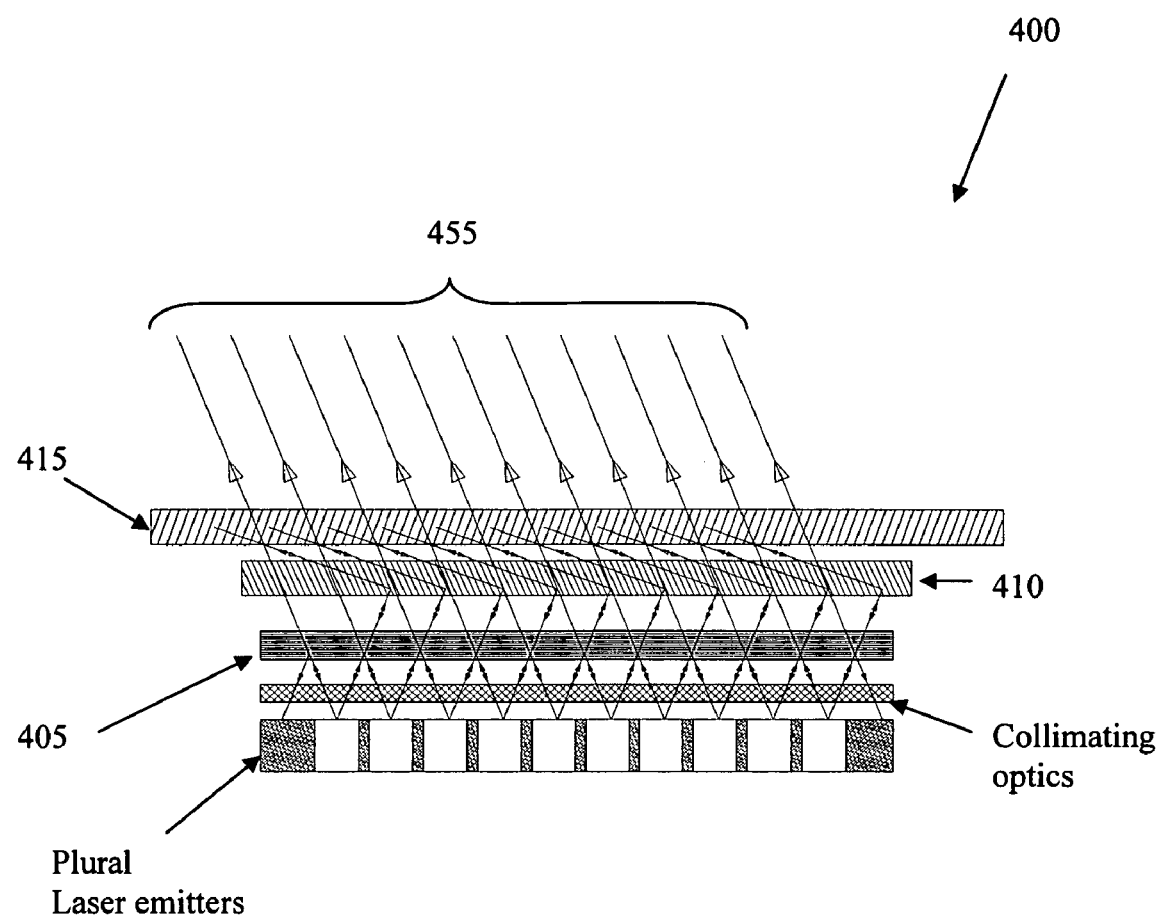
FIG. 16 shows a design of a multichannel laser system with wide aperture where the first reflecting grating provides exchange of radiation between channels, the second transmitting grating provides selection of a proper transverse mode, and the antireflecting grating works as an output coupler.

FIG. 16 shows another embodiment of the multi-channel volume Bragg laser 400 with Bragg gratings for interchannel coupling 405, transverse mode selection 410 and output coupling 415. The multi-channel volume Bragg laser 400 in this embodiment includes further separation of functions between gratings to provide an improved selection of a single supermode of a multichannel resonator. In this embodiment, the first Bragg grating 405 is a semitransparent Bragg mirror providing interchannel coupling. The second Bragg grating 410 is a transmitting Bragg grating to provide angular selection at the level of diffraction limit of divergence of radiation at the whole aperture of a multichannel aperture 455. To enable this function, a high spatial frequency transmitting Bragg grating 410 is the most appropriate choice. The third grating 415 is a reflecting Bragg grating functioning as a Bragg mirror reflecting back to the multi-channel volume Bragg resonator more than 95% of the radiation of a selected mode. As previously described, an optional partially reflecting Bragg mirror (not shown) can be placed in the output beam to optimize the output coupling efficiency.

Feasibility of the discussed approach is proven experimentally by the use of thick Bragg gratings recorded in a photo-thermo-refractive (PTR) glass. This approach may enable a new architecture for high power, narrow emission bandwidth laser systems. with near-diffraction limited divergence.

Figure 17:
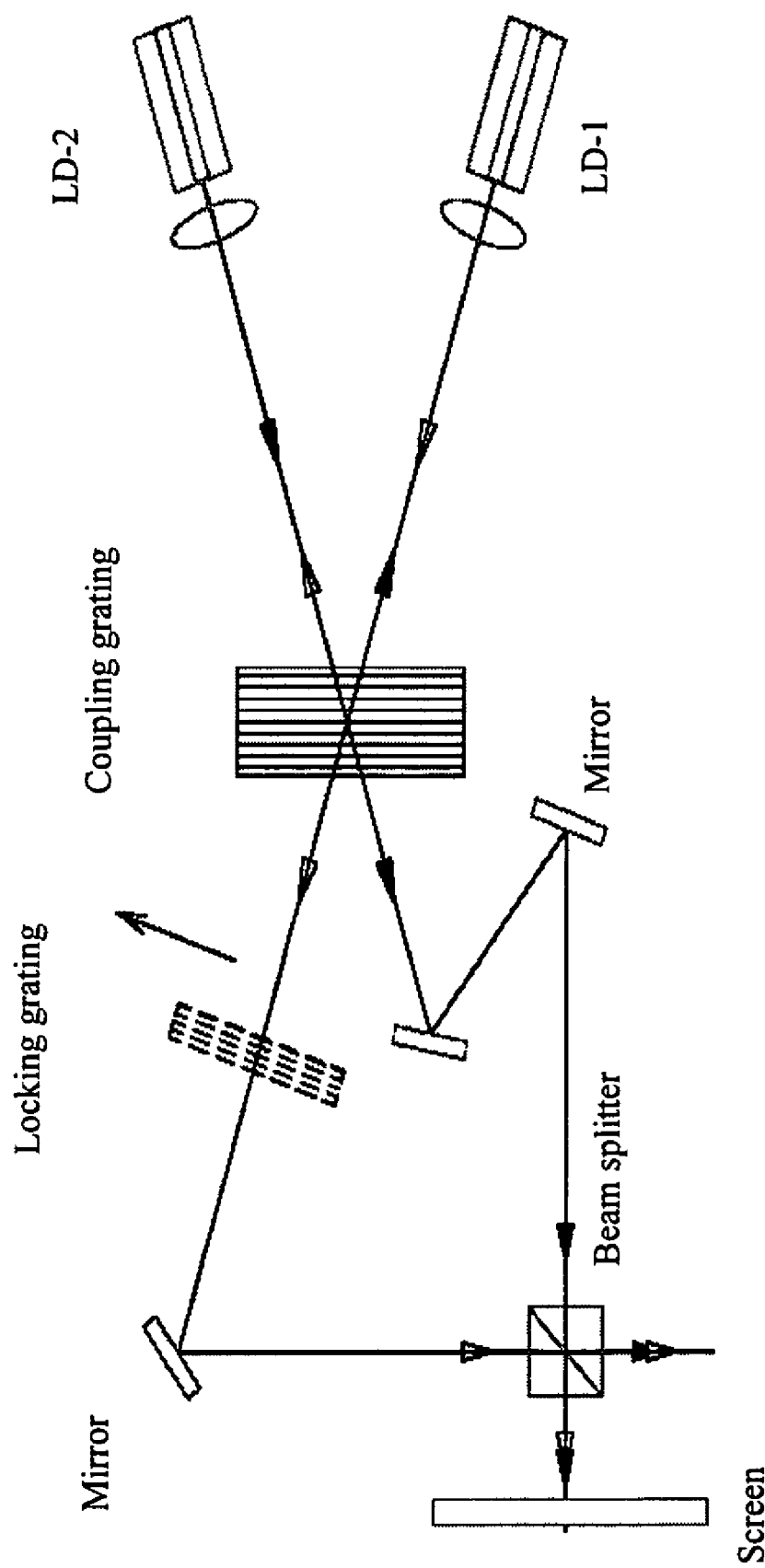
FIG. 17 shows a drawing of two single-mode laser diodes coherently coupled by a PTR Bragg grating.

Though this approach is universal for different types of lasers, the first demonstration was done with the use of semiconductor laser diodes. Gratings interacting with diode lasers are being studied for spectral narrowing and stabilization of high efficiency laser diodes. Experiments reported here demonstrate that long term coherent coupling of two single-transverse-mode semiconductor lasers mounted on well-separated stages can be achieved with the use of volume Bragg gratings as shown in Fig. 17.

Two PTR Bragg gratings each having a spectral selectivity narrower than 100 pm were used for this experiment. First, a locking grating, working in a retroreflecting mode, was placed in the beam of LD-1 causing spectral narrowing as shown in FIG. 18a from several nanometers to less than 30 pm. Second, a coupling grating was aligned to provide efficient diffraction of narrow-band emission as shown in FIG. 18b, from LD-1 to LD-2 thereby coupling these two lasers. After this was done, the locking grating is removed from the resonator while both lasers continued emitting the narrow lines separated by less than 100 pm but these beams were not coherent for if they had been, interference fringes would have been seen instead of just the usual speckle pattern.

Figure 20:
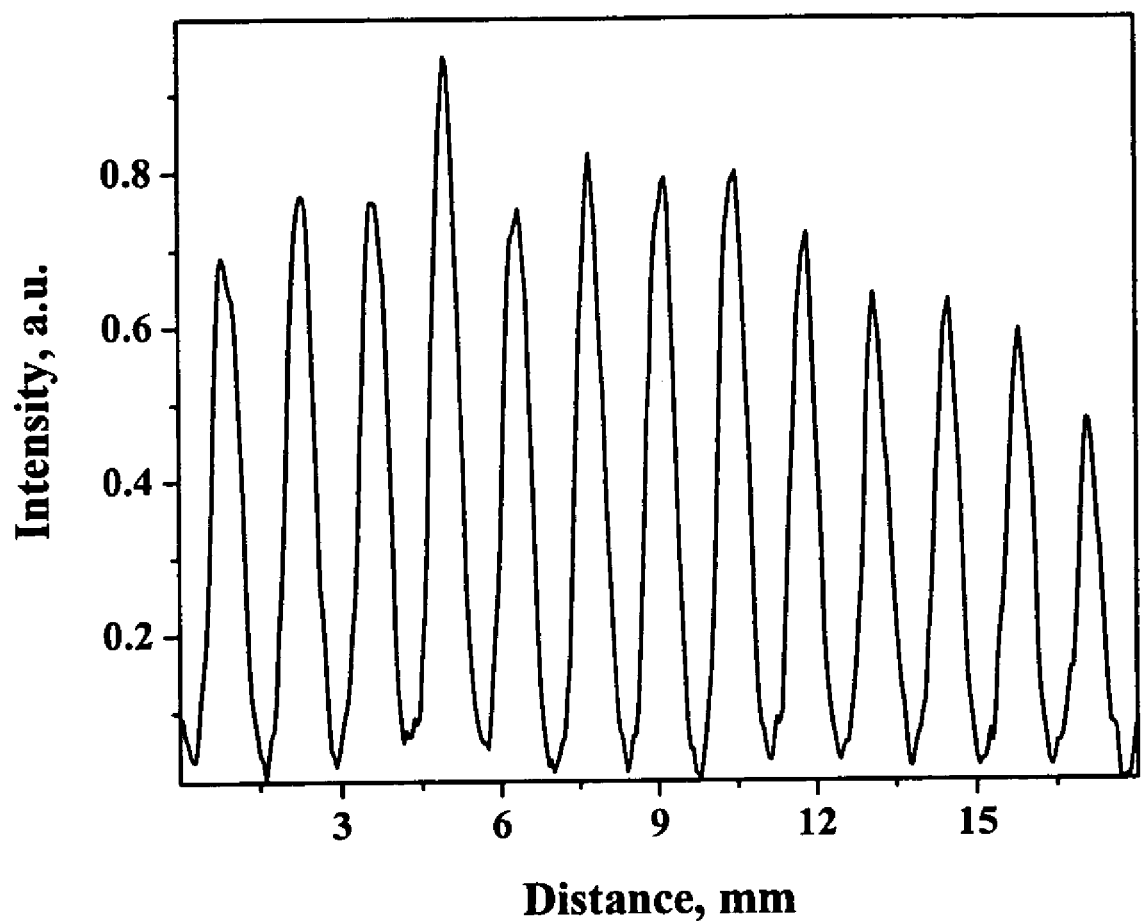
FIG. 20 is a graph showing the interference pattern produced by combining of beams from two separated laser diodes coupled by a reflecting PTR Bragg grating.

However, it was found that in the case where the spectral width of the coupling grating (~40 pm) was less than the axial mode separation of the internal resonator (~70 pm) of the laser diodes, fine tuning of the system resulted in the locking of both lasers to the same frequency. In this case, the emission spectra of both lasers is identical; when these two beams were combined the interference pattern shown in FIG. 19 (the dark and light lines at 45 degrees) was produced. This interference pattern was stable for a long period which is remarkable taking into account that the diodes and the coupling grating were mounted on three different stages at about 10 cm height above the optical bench. High contrast of the interference pattern which is shown in FIG. 20 is the evidence of high level of coherence of radiation emitted by two separated lasers. Thus, this shows that two separated lasers coupled by a PTR Bragg grating can behave as a single coherent source of light.

Complex Diffractive Element

Effective mode control in a laser resonator requires a number of optical components including focusing and diffracting components. The PTR glass enables recording of multiple elements in the same volume which reduces the size of the optical system and enhance its robustness. Another improvement of the present invention is creation of nonplanar diffractive optical elements. Alternative approaches are based on banding of planar grating by glass plate hot molding, recording of UV holograms which are calculated for IR imaging, etc. In this case, collimating and diffracting optics can be combined in the same element which provides compaction of the whole optical system in increase of its robustness.

High power lasers including solid state, fiber, and semiconductor ones with diffraction limited divergence and stable wavelength. Those devices will find great applications in military laser systems, optical communication, remote sensing, laser technology, e.g. cutting, welding, drilling, and the like.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A volume Bragg laser emitting in a window of transparency of photo-thermo-refractive (PTR) glass having an absolute diffraction efficiency exceeding approximately 95% comprising:
   a lasing emitter for emitting a laser radiation; and
   an external resonator including a photo-thermo-refractive (PTR) volume diffractive elements coupled with an output of the lasing emitter for receiving the laser radiation and providing control of at least one of a spectral parameter and an angular parameter of said laser radiation.

2. The laser of claim 1 wherein said PTR volume diffractive element comprises:
   at least one volume Bragg grating recorded in a photo-thermo-refractive (PTR) glass having an absolute diffraction efficiency exceeding approximately 95% in transmitting mode and reflecting mode for use in selection of a corresponding at least one of a transverse mode and a longitudinal mode and providing thermal stabilization.

3. The laser of claim 2 wherein said at least one volume Bragg grating comprises:
   at least one transverse mode grating within said PTR glass to provide transverse mode selection and angular selectivity.

4. The laser of claim 2 wherein said at least one volume Bragg grating comprises:
   at least one longitudinal mode grating within said PTR glass to provide a longitudinal mode selection and a spectral selectivity.

5. The laser of claim 4 further comprising:
   at least one transverse mode grating within said PTR glass to provide transverse mode selection and an angular selectivity.

6. The volume Bragg laser of claim 4 wherein the window of emission of said laser has a transparency of said PTR glass that ranges from approximately 300 nm to approximately 3000 nm.

7. A laser according to claim 1 wherein said lasing emitter is one of a solid state, semiconductor, liquid and gas laser.

8. A semiconductor laser according to claim 6 wherein said semiconductor laser is one of an edge emitting laser diodes, a vertical cavity surface emitting lasers (VCSELs), and a grating coupled surface emitting lasers (GCSELs).

9. A multi-channel Bragg resonator for a multi-channel volume Bragg laser comprising:
   plural volume Bragg gratings recorded in photo-thermo-refractive (PTR) glass having an absolute diffraction efficiency exceeding 95% in transmitting mode and reflecting mode functioning as a back mirror for transverse mode and longitudinal mode selection and for thermal stabilization; and
   at least one reflective device between plural adjacent laser emitters and the plural volume Bragg gratings for inter channel coupling between adjacent channels to increase an Output coupling efficiency.

10. The multi-channel Bragg resonator of claim 9 wherein said volume Bragg grating comprises:
    at least one transmitting mode Bragg grating corresponding to each channel to provide angular selection in a direction perpendicular to an optical axis of a corresponding laser emitter.

11. The multi-channel Bragg resonator of claim 9 wherein said volume Bragg grating comprises:
    at least one reflecting mode Bragg grating corresponding to each channel to provide spectral selectivity and a selection of an orthogonal transverse mode.

12. The multi-channel Bragg resonator of claim 9 wherein said plural high efficiency volume Bragg grating comprise:
    a first Bragg reflective Bragg grating that functions as an interchannel coupler to provide an exchange of radiation between said adjacent channels; and
    a second Bragg reflective grating to function as a mirror to reflect back a selected longitudinal mode and transverse mode.

* * * * *

UNITED STATES PATENT AND TRADEMARK OFFICE
CERTIFICATE OF CORRECTION

| | | |
|---|---|---|
| PATENT NO. | : 7,394,842 B2 | Page 1 of 1 |
| APPLICATION NO. | : 11/114767 | |
| DATED | : July 1, 2008 | |
| INVENTOR(S) | : Leonid B. Glebov | |

It is certified that error appears in the above-identified patent and that said Letters Patent is hereby corrected as shown below:

Col. 1, lines 17-18 should read

STATEMENT REGARDING FEDERALLY SPONSORED RESEARCH OR DEVELOPMENT

This subject invention was made with government support under DARPA, federal contract number HR00110410004 and the Air Forces Research Laboratory contract No. HR-01-1041-0004. The government has certain rights in this invention.

Signed and Sealed this
Eighth Day of March, 2011

David J. Kappos
*Director of the United States Patent and Trademark Office*